(12) United States Patent
Aley et al.

(10) Patent No.: US 10,520,567 B2
(45) Date of Patent: Dec. 31, 2019

(54) COMBINED SHIM AND BORE COOLING ASSEMBLY

(71) Applicant: SIEMENS HEALTHCARE LIMITED, Camberley (GB)

(72) Inventors: Nicholas Aley, Witney (GB); Neil John Belton, Didcot (GB); Martin Howard Hempstead, Ducklington (GB); Marcel Kruip, Oxford (GB); Patrick William Retz, Witney (GB)

(73) Assignee: Siemens Healthcare Limited, Camberley (GB)

( * ) Notice: Subject to any disclaimer, the term of this patent is extended or adjusted under 35 U.S.C. 154(b) by 89 days.

(21) Appl. No.: 15/510,300

(22) PCT Filed: Sep. 9, 2015

(86) PCT No.: PCT/EP2015/070558
§ 371 (c)(1),
(2) Date: Mar. 10, 2017

(87) PCT Pub. No.: WO2016/038068
PCT Pub. Date: Mar. 17, 2016

(65) Prior Publication Data
US 2017/0285121 A1 Oct. 5, 2017

(30) Foreign Application Priority Data

Sep. 12, 2014 (GB) .................................. 1416170.7
Mar. 18, 2015 (GB) .................................. 1504523.0

(51) Int. Cl.
*G01V 3/00* (2006.01)
*G01R 33/3873* (2006.01)
*G01R 33/34* (2006.01)
*G01R 33/3815* (2006.01)
*G01R 33/38* (2006.01)

(52) U.S. Cl.
CPC ..... *G01R 33/3873* (2013.01); *G01R 33/3403* (2013.01); *G01R 33/3815* (2013.01); *G01R 33/38* (2013.01); *G01R 33/3804* (2013.01)

(58) Field of Classification Search
USPC ........................................................ 324/320
See application file for complete search history.

(56) References Cited

U.S. PATENT DOCUMENTS

| 4,990,877 A | 2/1991 | Benesch |
| 5,389,909 A | 2/1995 | Havens |
| 5,786,695 A | 7/1998 | Amor et al. |

(Continued)

FOREIGN PATENT DOCUMENTS

| CN | 101226232 A | 7/2008 |
| GB | 2483854 A | 3/2012 |

(Continued)

OTHER PUBLICATIONS

Office Action dated Jul. 8, 2019 for Japanese Patent Aplication No. 2017-513716.

*Primary Examiner* — Rodney E Fuller
(74) *Attorney, Agent, or Firm* — Schiff Hardin LLP

(57) ABSTRACT

For shimming a background magnetic field of a magnetic resonance imaging apparatus having an outer vacuum chamber (OVC) bore tube, a shimming arrangement has rails on the OVC bore tube and shim trays are mounted between respective rails.

10 Claims, 9 Drawing Sheets

(56) References Cited

U.S. PATENT DOCUMENTS

| | | | |
|---|---|---|---|
| 6,529,005 B1 | 3/2003 | Kasten et al. | |
| 7,589,531 B2 * | 9/2009 | Yamashita | G01R 33/3856 |
| | | | 324/318 |
| 7,683,624 B2 * | 3/2010 | Tamura | G01R 33/3815 |
| | | | 324/320 |
| 8,680,862 B2 * | 3/2014 | Yamashita | G01R 33/3856 |
| | | | 324/318 |
| 9,857,444 B2 * | 1/2018 | Kwak | G01R 33/4215 |
| 2002/0140535 A1 | 10/2002 | Neuberth | |
| 2003/0025501 A1 | 2/2003 | Ideler | |
| 2003/0206018 A1 | 11/2003 | Gebhardt et al. | |
| 2006/0208732 A1 | 9/2006 | Shen et al. | |
| 2007/0272394 A1 | 11/2007 | Heid | |
| 2008/0169813 A1 | 7/2008 | Yamashita et al. | |
| 2010/0237867 A1 | 9/2010 | Slade | |
| 2011/0074419 A1 * | 3/2011 | Sakakura | G01R 33/3854 |
| | | | 324/318 |
| 2014/0061202 A1 | 3/2014 | Mathieu et al. | |
| 2015/0168520 A1 * | 6/2015 | Kwak | G01R 33/4215 |
| | | | 324/318 |

FOREIGN PATENT DOCUMENTS

| | | |
|---|---|---|
| JP | H5-220127 A | 8/1993 |
| JP | 2006311957 A | 11/2006 |
| JP | 2008-220923 A | 9/2008 |
| JP | 2011115480 A | 6/2011 |
| JP | 2012011060 A | 1/2012 |

* cited by examiner

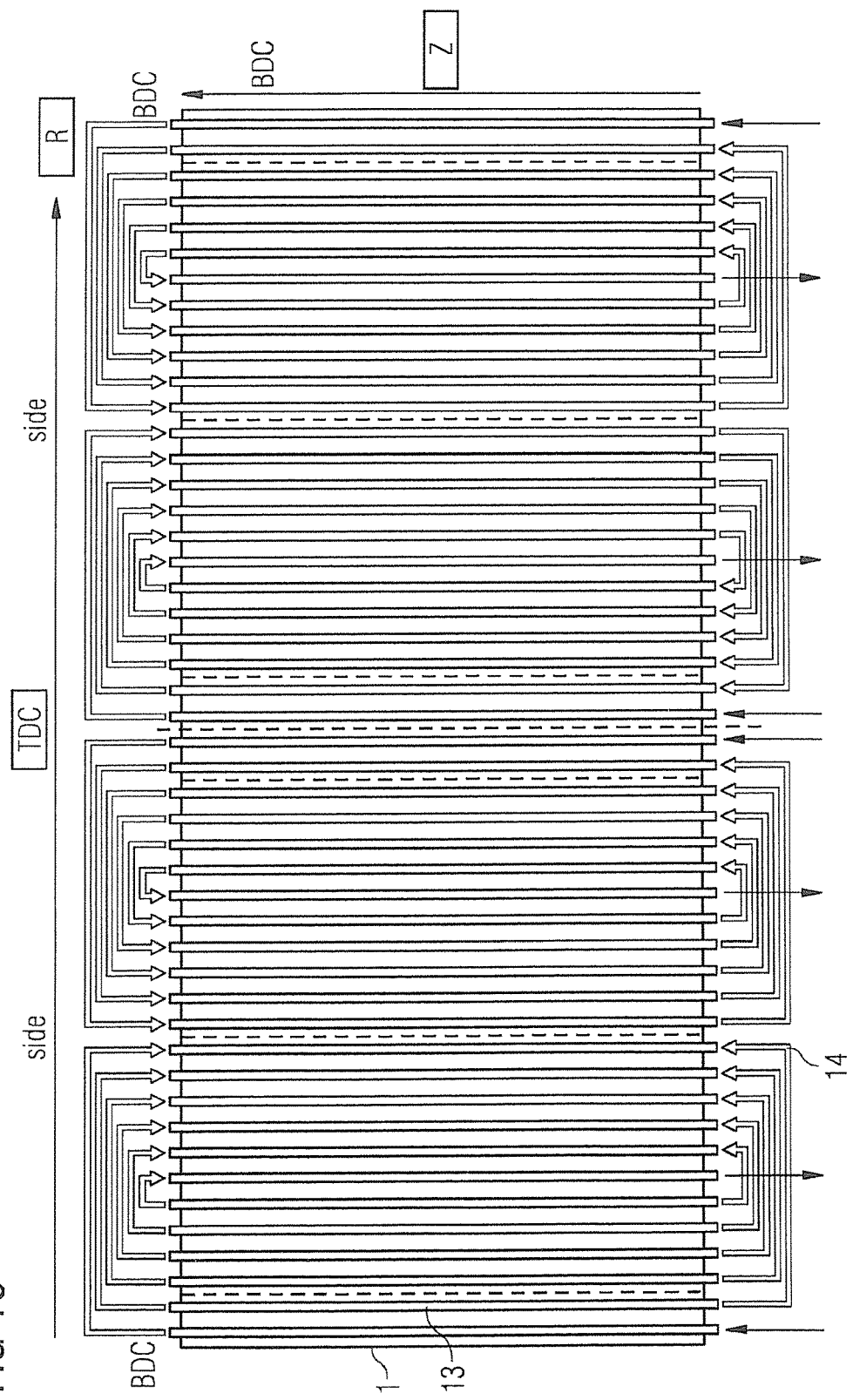

COMBINED SHIM AND BORE COOLING ASSEMBLY

BACKGROUND OF THE INVENTION

Field of the Invention

The present invention concerns a combined shim and bore cooling assembly for a magnetic resonance imaging apparatus.

Description of the Prior Art

In a magnetic resonance imaging (MRI) apparatus, the homogeneity and the stability of the background magnetic field is of high relevance for the quality of the measurement. To improve the homogeneity of the background magnetic field, passive shimming may be used, which involves shim elements, being pieces of steel with good magnetic qualities placed near the imaging region. The shim elements get magnetized and distort the background magnetic field. The shims are arranged so that the resultant distortion makes the background field more homogeneous.

Superconducting magnets for MRI apparatus are commonly cylindrical in shape and housed within a cylindrical cryostat. The cylindrical cryostat has an outer vacuum chamber (OVC) with a cylindrical bore tube, which encloses an imaging region. It is known that an increase of the temperature in an outer vacuum chamber bore tube and in the shims can cause a drift of the magnetic field in the magnetic resonance imaging apparatus due to changes in the magnetic permeability of the material. Such an increase in temperature may be caused by gradient field coils housed within the OVC bore tube and generating oscillating magnetic fields as required for imaging by the MRI system. The gradient coils themselves heat during operation, and their oscillating magnetic fields induce electrical currents in nearby conducting surfaces such as shims and OVC bore tube, causing warming of those surfaces.

SUMMARY OF THE INVENTION

An object of the present invention is to stabilize the temperature of the shims and OVC bore tube during imaging.

Although the following description will preferentially refer to "cooling", the invention applies to temperature stabilization. For example, "cooling fluid" and "coolant" described below may act to warm some parts of the apparatus and cool others, so as to stabilize the temperature of the whole.

An arrangement is provided in accordance with the invention for shimming the magnetic field of a magnetic resonance imaging apparatus having an outer vacuum chamber bore tube, wherein a shim tray containing shim elements is provided and the shim tray is mounted on rails themselves mounted on the outer vacuum chamber bore tube, whereby the shim tray can slide along the rails, in which rails a channel system containing cooling fluid is at least partially arranged.

The shim tray allows a compact fixation of the shim elements. This is of relevance as the shim elements are subjected to high forces caused by the magnetic field.

By making the shim tray and the rails at least partly of thermally-conductive material, the cooling fluid acts to cool the OVC bore tube, the shim tray and the shim elements.

Arranging the channel system containing cooling fluid in at least some of the rails allows a direct and good thermal contact between the channel system containing cooling fluid, so heat can be transferred from the shim elements, through the shim tray and the rails to the cooling fluid in the channel system very efficiently. Also, cooling of the outer vacuum chamber bore tube is achieved by this arrangement of the channel system containing the cooling fluid.

Multiple arrangements of shim trays in channels may be located adjacent one another around the cylindrical OVC bore tube. The cooled shim trays may then also act as a thermal shield, protecting the OVC bore tube from radiant heat emitted from the gradient coil assembly. The shim elements, and possibly also the shim trays, are electrically conductive and may also shield the OVC bore tube from oscillating magnetic fields generated by the gradient coils assembly. Such shim tray assembly may thus further stabilise the temperature of the outer vacuum chamber bore tube.

The preferred cooling fluid is water. Water has a high specific heat at temperatures around room temperature, is non-toxic, inexpensive and readily available. Other cooling fluids also can be used.

The rails are preferably aligned with an axis of symmetry of the OVC bore tube and allow adjustment of the shim tray position along the rails, allowing adjustment of the shimming effect of the shim elements in the shim tray. At least one of the rails and/or at least one shim tray may be at least partially manufactured from a ferromagnetic material enhancing the shimming effect further.

In a further embodiment of the invention the shim tray has a bottom piece, and a lid, which may be secured to the bottom piece. Such arrangement allows the shim elements to be placed in the shim tray in such a manner that high forces can safely act on the shim elements. The bottom piece and the lid should both be in thermal contact with the rails. This may be achieved by placing the bottom piece and the lid in thermal contact with each other, and one or other of the bottom piece and the lid in thermal contact with the rails, for example by an interference fit.

In a further embodiment of the invention the shim tray is cuboid-shaped. The available shim elements are typically thin rectangular pieces of sheet steel. Such elements can be placed in a cuboid-shaped tray in a space-efficient manner.

In a further embodiment of the invention the rails have grooves, so that the shim tray can slide in the grooves of the rails. Rails with grooves cause a very good guidance. By suitably shaping the grooves and the shim trays, effective thermal contact between the rails and the shim trays may be ensured.

In a further embodiment of the invention the shim tray and/or the rails have a shimming effect in addition to the shimming effect of the shim elements. This is normally achieved by using at least partially ferromagnetic or paramagnetic material for the shim tray and/or the rails.

In a further embodiment of the invention, a position of the shim tray can be adjusted to allow a larger range of magnetic field inhomogeneity to be shimmed. A way to realize this is with the rails as mentioned above, and a suitable fixing arrangement to hold the shim tray in a desired position along the length of the rails.

In a further embodiment of the invention, cooling fluid can flow through the channel system in the rails and can be cooled by flowing through a cooler. In the cooler the heat transferred in the cooling fluid can be extracted and dissipated. The cooling fluid is cooled and can be fed in the channel system again. In most cases the cooler is a chiller, in which the heat of the cooling fluid is transferred to another fluid or to the environment.

In a further embodiment of the invention the thermal mass of the cooling fluid is high enough to essentially stabilize the temperature of the shims, the shim tray and the outer vacuum chamber bore tube. In this way the temperature of the shim elements is stabilized. In this case a cooler as described above is not necessary. The two approaches, of cooling the cooling fluid in a cooler; and providing a high thermal mass can be combined. For providing a high thermal mass a suitable cooling fluid, normally water should be used. Furthermore the cooling system should have sufficient dimensions to give a sufficiently large thermal capacity. Also an external reservoir for the cooling fluid can increase the thermal mass of the cooling fluid. The advantage of a high thermal mass is a self-stable mechanism, so no control or only a simple control is needed.

If the dimension of the channel system is high enough even circulation of the cooling fluid in some cases is not necessary. The coolant circuit may be arranged such that circulation of the coolant is driven solely by thermal expansion and contraction of the coolant fluid, in a mechanism known as a thermosiphon.

BRIEF DESCRIPTION OF THE DRAWINGS

FIGS. 4 through 10 each schematically show an arrangement of passageways and conduits in various different embodiments of the shim and bore cooling assembly in accordance with the present invention.

DESCRIPTION OF THE PREFERRED EMBODIMENTS

Figure 1:
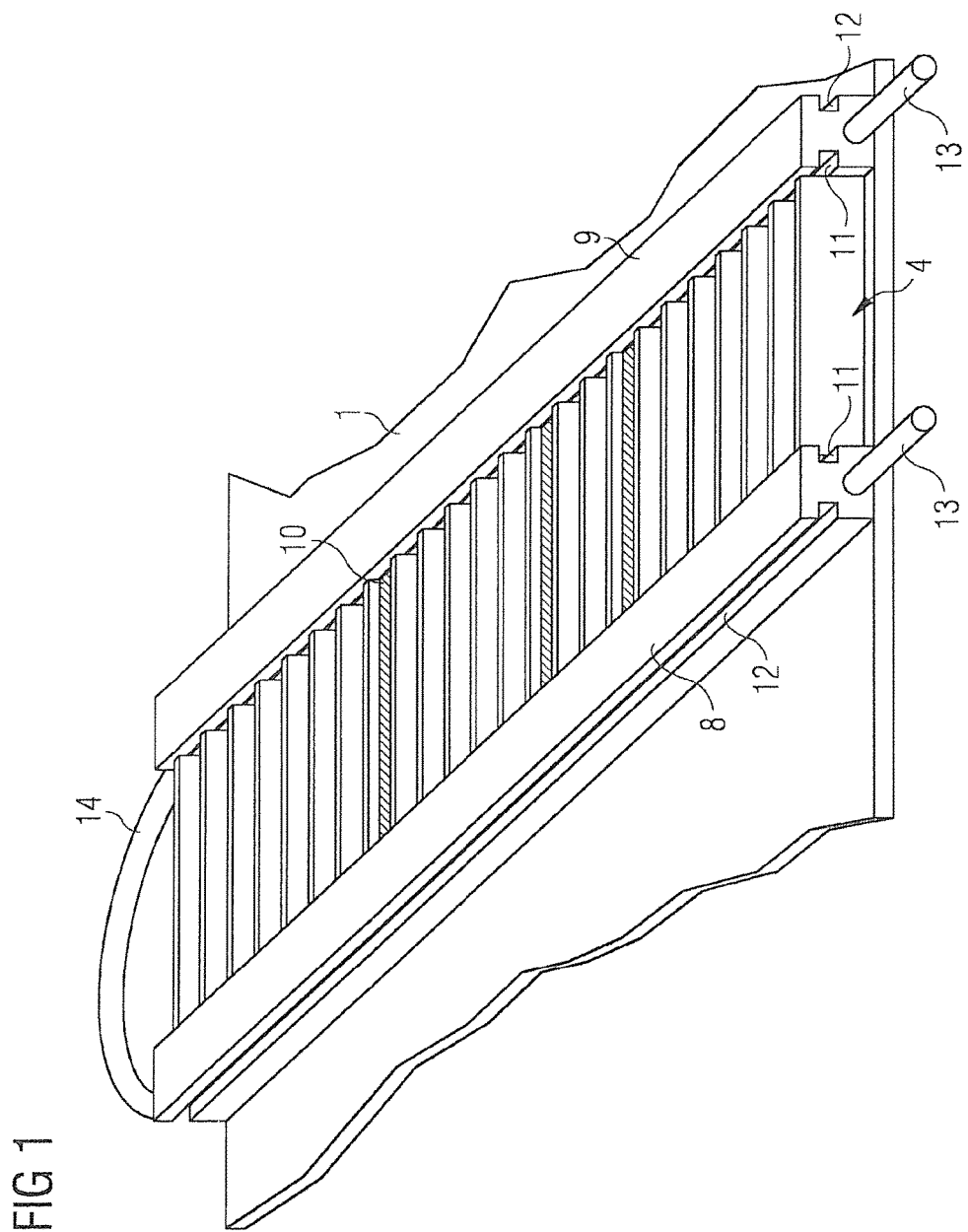
FIG. 1 shows a three-dimensional fragmentary view of an outer vacuum chamber bore tube, with an example of shim trays mounted on the rails of the inner side of the bore tube.

FIG. 1 shows a part of an outer vacuum chamber bore tube 1. On the radially inner cylindrical surface of the outer vacuum chamber bore tube 1 is mounted shim tray 4. The shim tray 4 is illustrated without lid, so that shim pockets provided for accommodating shim elements 10 within the shim tray can be seen. In use, however, a lid would typically be provided to enclose the shim pockets. It may be possible to dispense with the lid if the shim elements are otherwise secured to the shim tray.

Rails 8, 9 are shown, secured to the OVC bore tube 1 on its radially inner surface. Since the OVC must be vacuum-tight, rails 8, 9 are preferably attached by means which do not require penetration of the OVC, such as brazing or adhesive bonding. The shim tray has lateral lips 11 which locate within corresponding grooves 12 in rails 8, 9. Preferably, there is an interference fit between the lips 11 and the rails 8, 9 to provide effective thermal contact. Rails 8, 9 each include at least one fluid passageway 13 which may be a tubular element 13 as schematically illustrated, or may be a feature of the rails themselves. Preferably, rails 8, 9 are formed by machining or extrusion of a metal or other thermally conductive material, to include a fluid passageway. The fluid passageways are connected by suitable conduits 14 into one or more circuits for circulation of cooling fluid.

The rails 8, 9 and shim tray 4 should be at least partially constructed of a thermally conductive material, and shim elements 10 should be in thermal contact with the shim tray, to ensure effective transfer of heat from shim elements and OVC bore tube to the cooling fluid.

Retention of shim tray 4 by rails 8, 9 allows the movement of the shim tray along the length of the rails. By moving the shim tray, the position and shimming effect of the shim elements 10 can be adjusted. A mechanism should be provided to retain each shim tray at its chosen position.

The passageways 13 within the respective rails 8, 9 are connected together by conduits 14 to define at least one circuit for the circulation of a cooling fluid. In the arrangement shown in FIG. 2, the cylindrical OVC bore tube is shown flattened, for ease of representation. Each rail 8, 9 has a groove 12 which holds a respective lateral lip 11 of each of two adjacent shim trays 4. Each shim tray as illustrated comprises a bottom part 16 and a lid 18, mechanically linked together. Alternatively, deeper grooves 12 may be provided in each rail, and may accommodate edges of the shim trays. Preferably, both the bottom part 16 and the lid 18 are thermally conductive, and they are in thermal contact with one another. In an arrangement such as represented in FIG. 2, the entire cylindrical OVC bore tube 1 may be, and preferably is, lined with shim trays 4 and rails 8, 9, forming a thermal shield for the OVC bore tube 1, as mentioned above.

The shim tray 4, the rails 8 and 9, and the outer vacuum chamber bore tube 1, all are at least partially made from a thermally conductive material, or a thermally conductive composite material. This is required to enable thermal contact to a channel system containing a cooling fluid, arranged within the rails 8 and 9.

Figure 2:
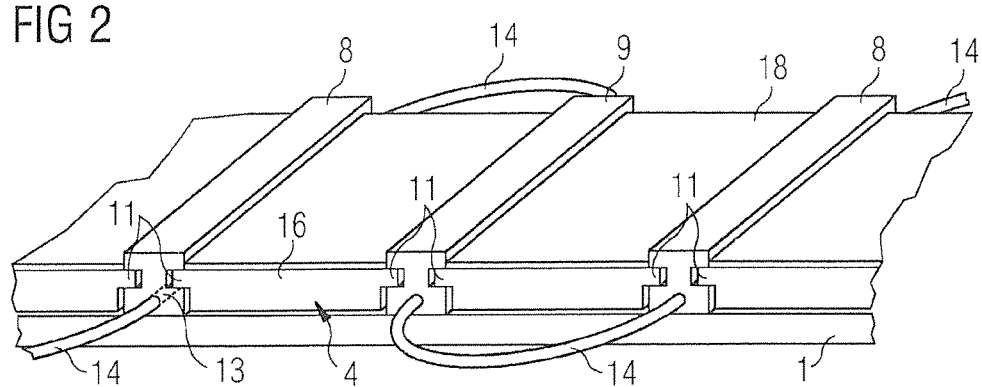
FIG. 2 shows an arrangement similar to that of FIG. 1, but with multiple arrangements of shim trays in channels located adjacent to each other, around a cylindrical OVC bore tube.
Figure 3:
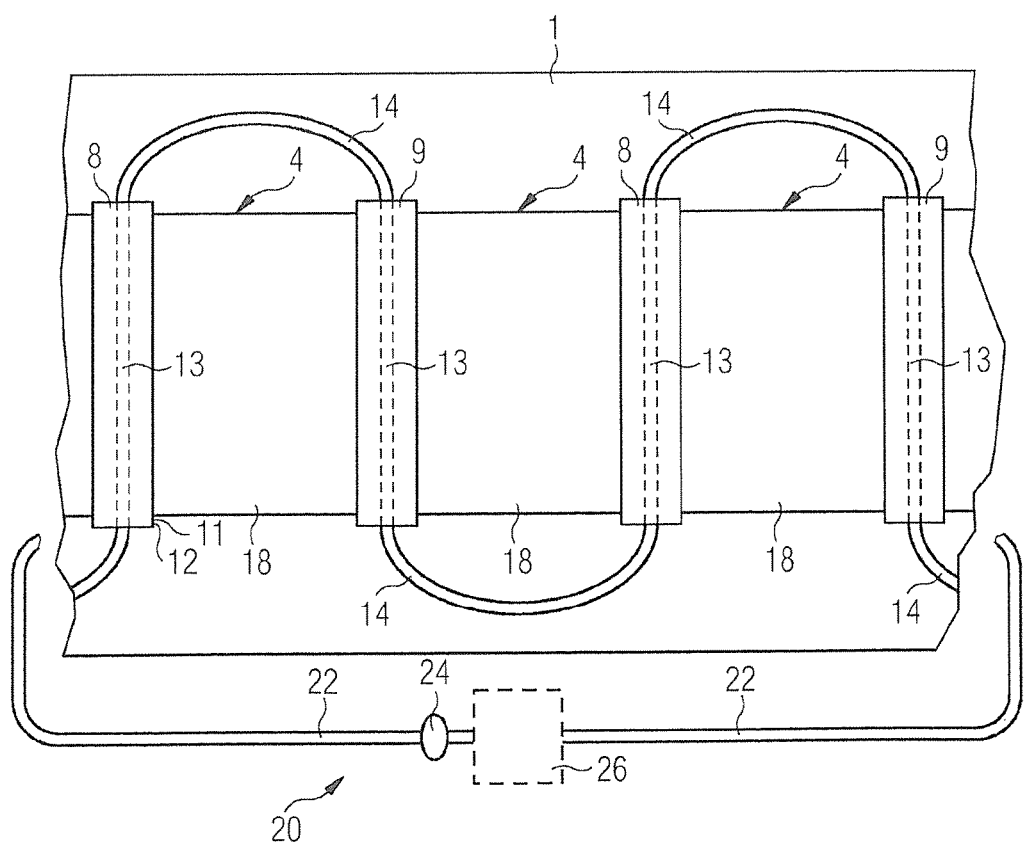
FIG. 3 shows another a view of the arrangement of FIG. 2, including an overview of the channel system containing cooling fluid.

FIG. 3 shows an alternative view of the arrangement of FIG. 2, as if looking radially outward from the axis of the OVC bore tube. The surface of the OVC bore tube 1 thus appears flattened. Preferably, as illustrated, the conduits 14 do not protrude beyond the axial extremities of the OVC bore tube 1. Shim trays 4 are provided around the radially inner surface of the OVC bore tube 1, each being located between a pair of rails 8, 9, as described with reference to FIG. 1.

Coolant circuit 20 has conduits 14, as well as passageways 13 within rails 8, 9. Further conduits 22 close the coolant circuit by connecting rails 8, 9 to a pump 24 or other circulator which causes the coolant fluid to circulate around the circuit 20. An optional reservoir or cooler 26 provides cooler fluid for recirculation around the circuit. A large mass of coolant may be provided, to limit temperature rise of the coolant, and/or an active or passive cooling arrangement may be provided.

It may be found possible to arrange conduits 14 and further conduits 22 such that circulator 24 is not required, and circulation of coolant fluid is driven only by expansion and contraction of the coolant fluid on heating and cooling—a mechanism that may be known as a thermosiphon.

In some embodiments, some rails 8, 9 may not be provided with a passageway 13, and/or may be excluded from the coolant circuit 20.

FIGS. 1-3 illustrate a simple arrangement in which all passageways are connected in series. Conduits 14 connect adjacent ends of passageways 13 of adjacent rails 8, 9 together into a single series connection which is then connected by further conduits 22 to pump 24 and cooler 26, if provided.

Other more complex arrangements may be provided for linking the passageways 13 together into a cooling circuit, and some preferred examples of this will be described below with reference to FIGS. 4-10. Each of FIGS. 4-10 represent, very schematically, an arrangement of passageways 13 and conduits 14 as described above. Each pair of adjacent channels 13 represented in FIGS. 4-10 represents a shim tray arrangement such as shown in FIG. 1. The view is "flattened", as in the case of FIGS. 2-3, so that the view resembles that which would be seen looking out from the axis of the OVC bore tube and rotating about that axis. Axial (Z) and circumferential (R) directions are indicated, along with positions of TDC, BDC and sides. Inlets and outlets for cooling fluid are represented by the appropriate arrow symbol.

The chosen conduit arrangement preferably provides as many of the following features as possible:
  effective to stabilize OVC bore temperature;
  minimize complexity of any required manifold;
  all conduit connections located at one axial end of the
    OVC bore tube, preferably at the opposite axial end to
    the location of gradient coil electrical connections;
  provide passive control of flow.

In the following description, "top-dead-centre" or "TDC" represents the uppermost position around the circumference of the OVC bore tube. Similarly, "bottom-dead-centre" or "BDC" represents the lowermost position around the circumference of the OVC bore tube. "Sides" of the OVC bore tube refer to diametrically opposite positions around the circumference of the OVC bore tube, positioned midway between TDC and BDC. For a cylindrical OVC bore tube, these will be the circumferential positions most distant from one another in a horizontal direction, and the circumferential positions intersected by a horizontal plane passing through the geometric axis of the cylindrical OVC bore tube.

Figure 4:
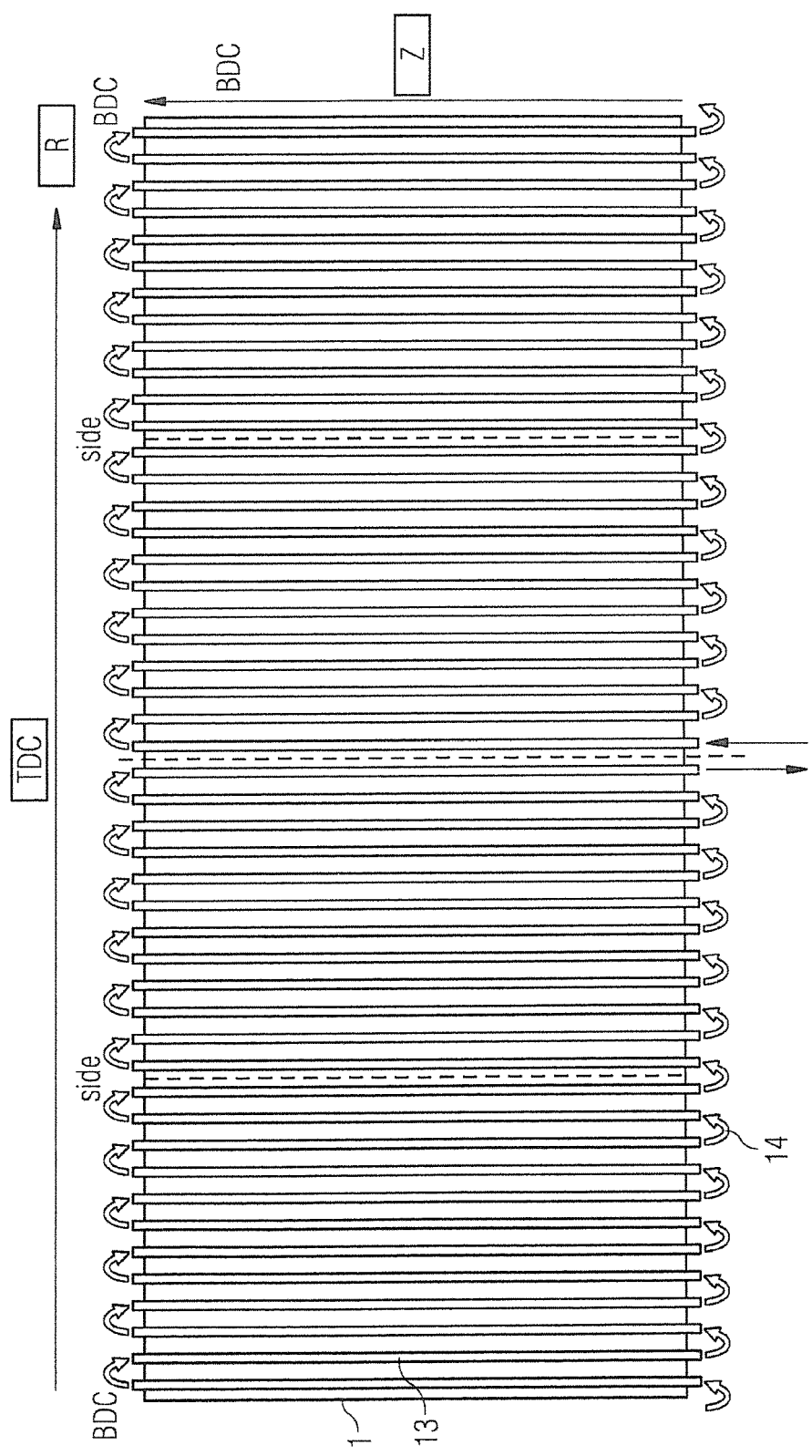

FIG. 4 represents the simple arrangement as already presented in FIGS. 1-3. The positions of TDC, BDC and the sides are marked. A single fluid inlet and a single fluid outlet are marked. All channels 13 are connected in series by conduits 14. In this example, the fluid inlet and the fluid outlet are both positioned at TDC. Although this represents a simple arrangement, and obviates the need for inlet and outlet manifolds, there is a large pressure drop in the cooling fluid through the series connection of conduits and channels. Cooling fluid (e.g. water) entering the series arrangement will flow through all of the channels, picking up heat as it goes. It is therefore necessary to provide a fast flow of cooling fluid in order to provide effective cooling over the whole surface of the OVC bore tube.

It has been observed that certain regions of the OVC bore tube 1 suffer from heating in use more than some other regions. The arrangement for connecting the passageways may be adapted to offer most effective cooling to the regions which suffer from most heating, thereby providing a more even temperature distribution over the surface of the OVC bore tube. In an example, it has been found that the OVC bore tube, in use, experiences increased heating at TDC and BDC, but reduced heating at the sides.

FIGS. 5-8 show alternative arrangements, in which the channel and conduit structure is arranged symmetrically about the positions TDC and BDC.

Figure 5:
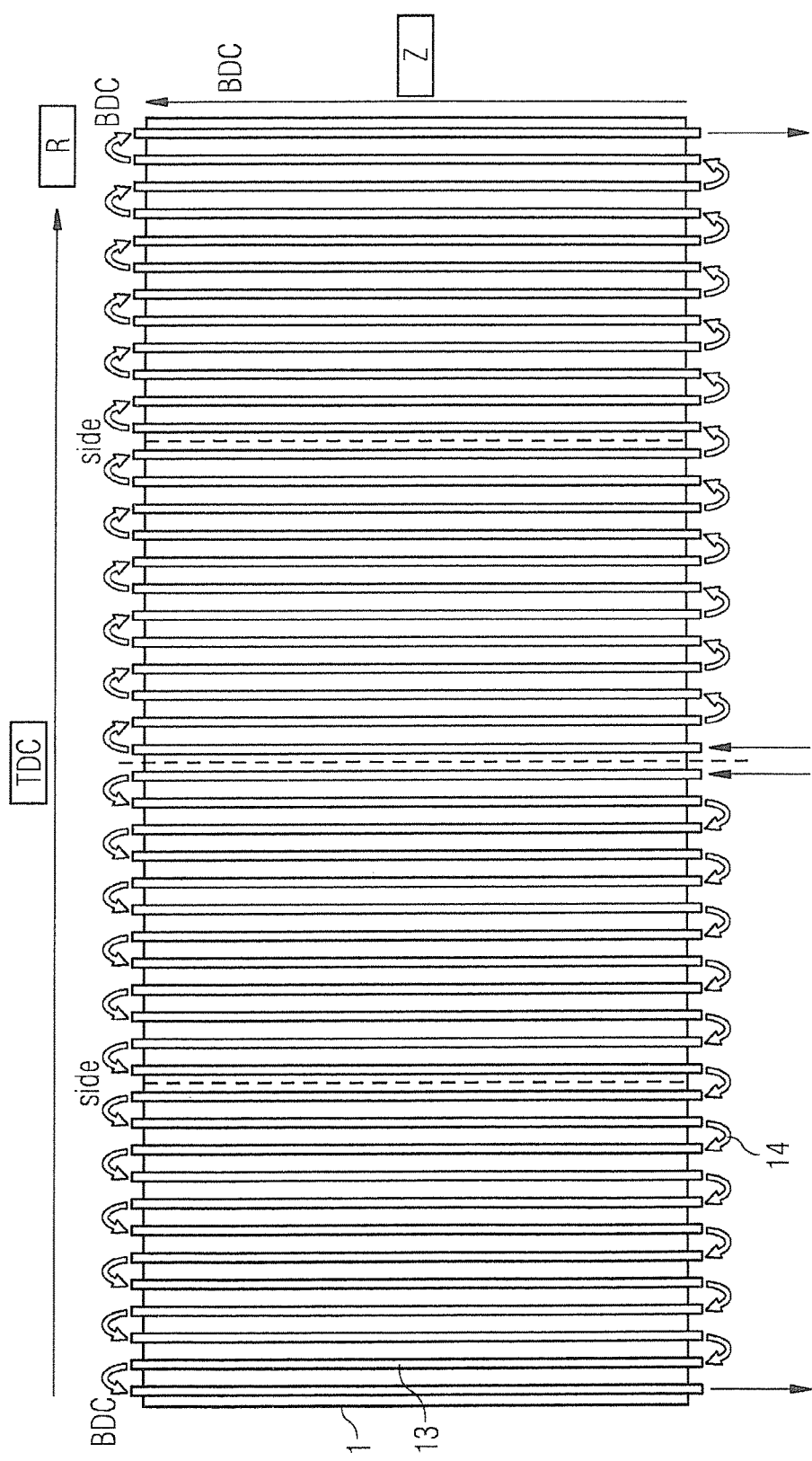

In FIG. 5, two parallel arrangements are provided, each consisting of half of the conduits 13 connected in series. Two inlets are provided at TDC, and respective outlets are provided at BDC. All of the channels on one side of a plane passing through the axis, TDC and BDC are connected in one series arrangement, while all of the channels on the other side of that plane are connected in the other arrangement. This enables fresh cooling fluid to be introduced at TDC, one of the sites suffering from greatest heating, and provide symmetrical cooling of the OVC bore tube. Cooling fluid leaves the channels and conduits at BDC. This flow opposes natural convection, and is believed to offer improved cooling. Alternatively, one cooling fluid inlet may be at TDC with the other at BDC, while cooling fluid outlets may similarly be arranged one at TDC, one at BDC. Such arrangement may provide more equal cooling effects at TDC and BDC.

Figure 6:
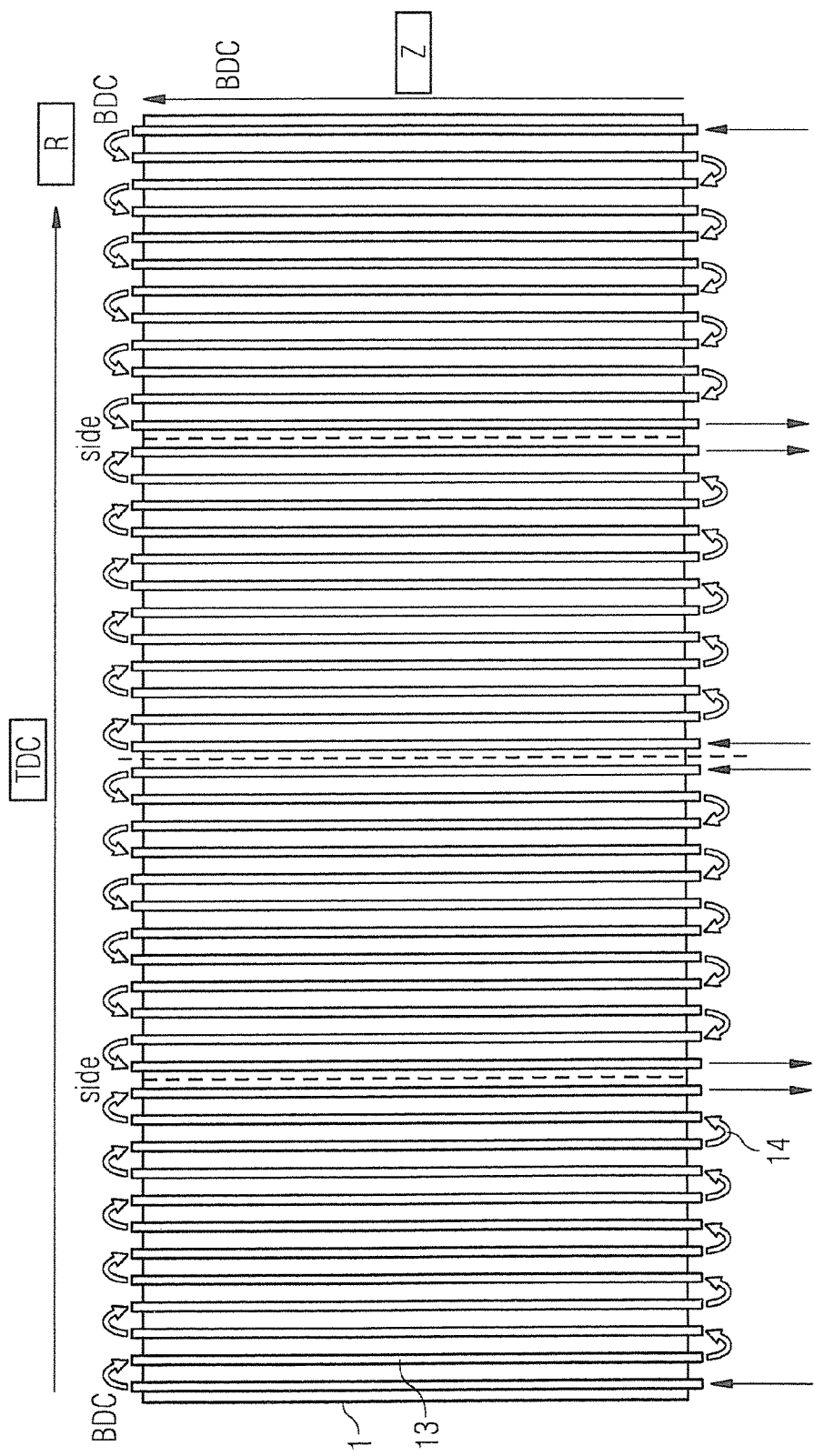

In the arrangement of FIG. 6, the channels are divided into four groups, corresponding to four quadrants of the OVC bore tube. In each case, cooling fluid is introduced at TDC or BDC, a region suffering from high levels of heating and leaves from the sides, regions which require less cooling, as they do not heat so much in use. The resultant temperature is more constant over the surface of the OVC bore tube. By dividing the channels into four groups, fresh cooling fluid may be introduced at four separate locations, and effective cooling may be achieved with a reduced flow of cooling fluid as compared to the arrangement of FIG. 4.

Figure 7:
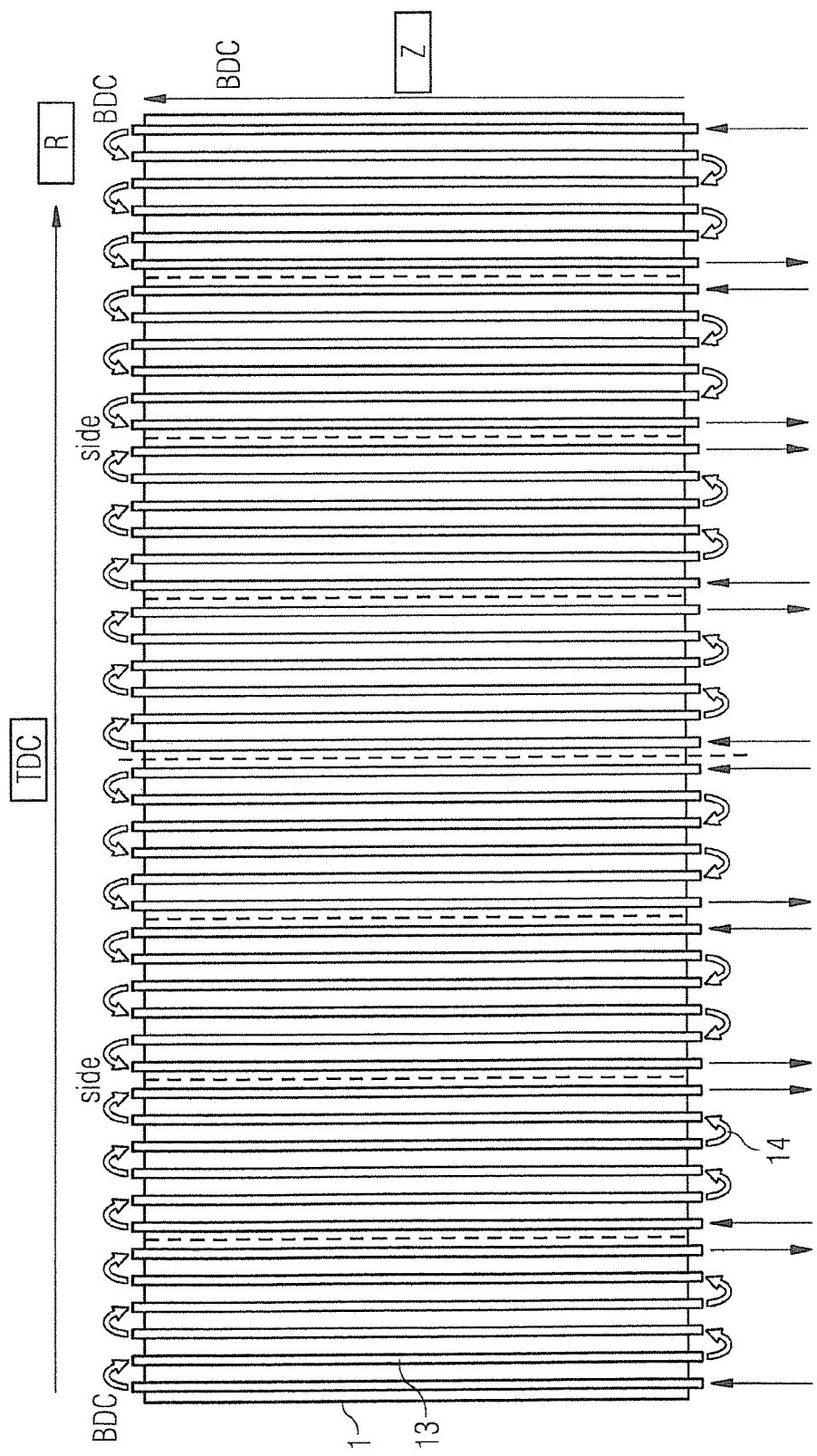

In the arrangement shown in FIG. 7, the channels are divided into eight groups. The cooling fluid inlets and outlets may be arranged symmetrically around the OVC bore tube to provide effective symmetrical cooling. Each group of channels is required to cool a reduced surface area of the OVC bore tubes and so may operate with reduced flow rate.

Figure 8:
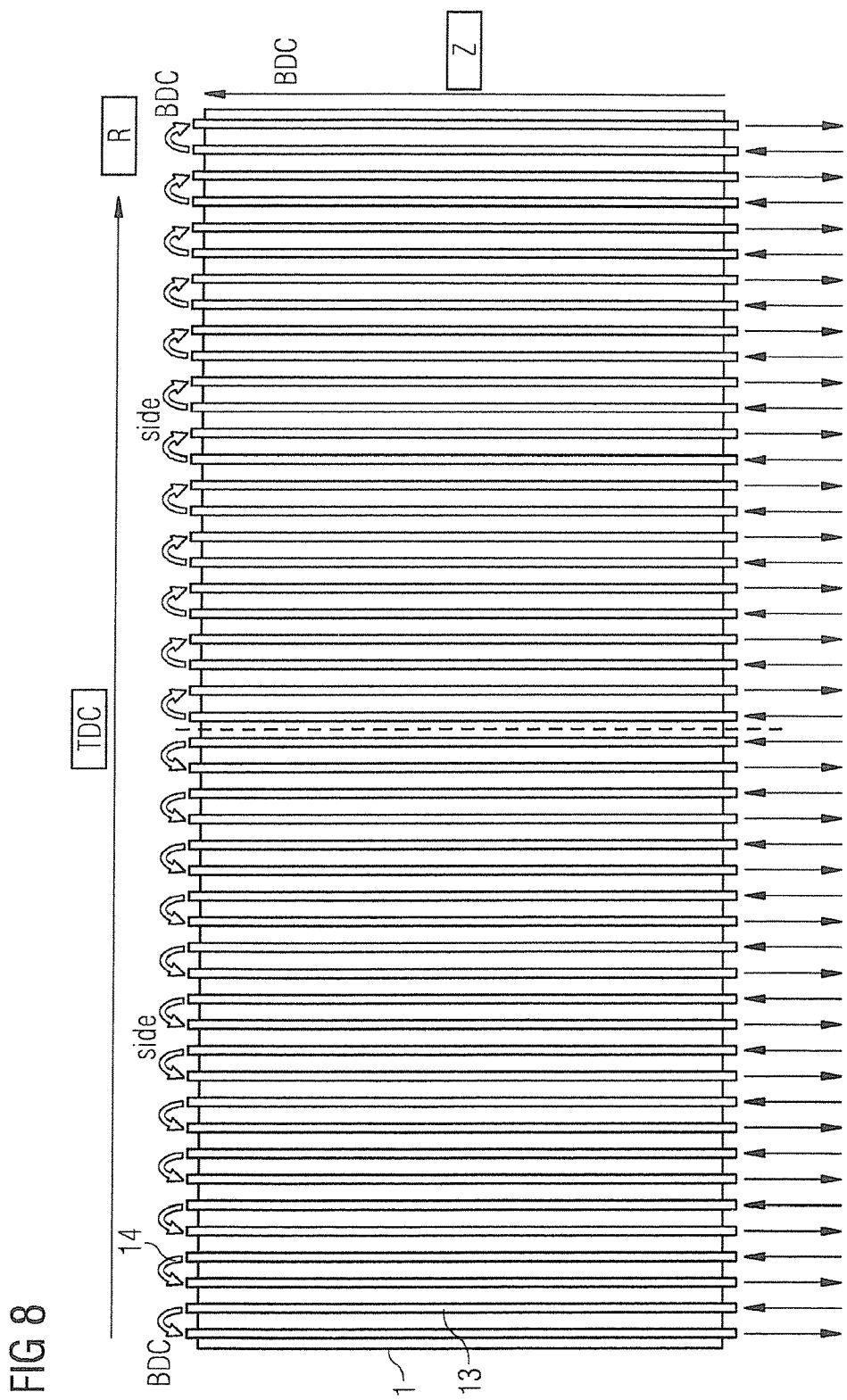

The arrangement of FIG. 8 shows this principle taken to its extreme, where each pair of channels has its own cooling fluid inlet and outlet. Flow rate of cooling fluid in each pair of channels may be controlled, for example using a valve, to provide a required amount of cooling for each pair and ensure a consistent temperature over the surface of the OVC bore tube.

Figure 9:
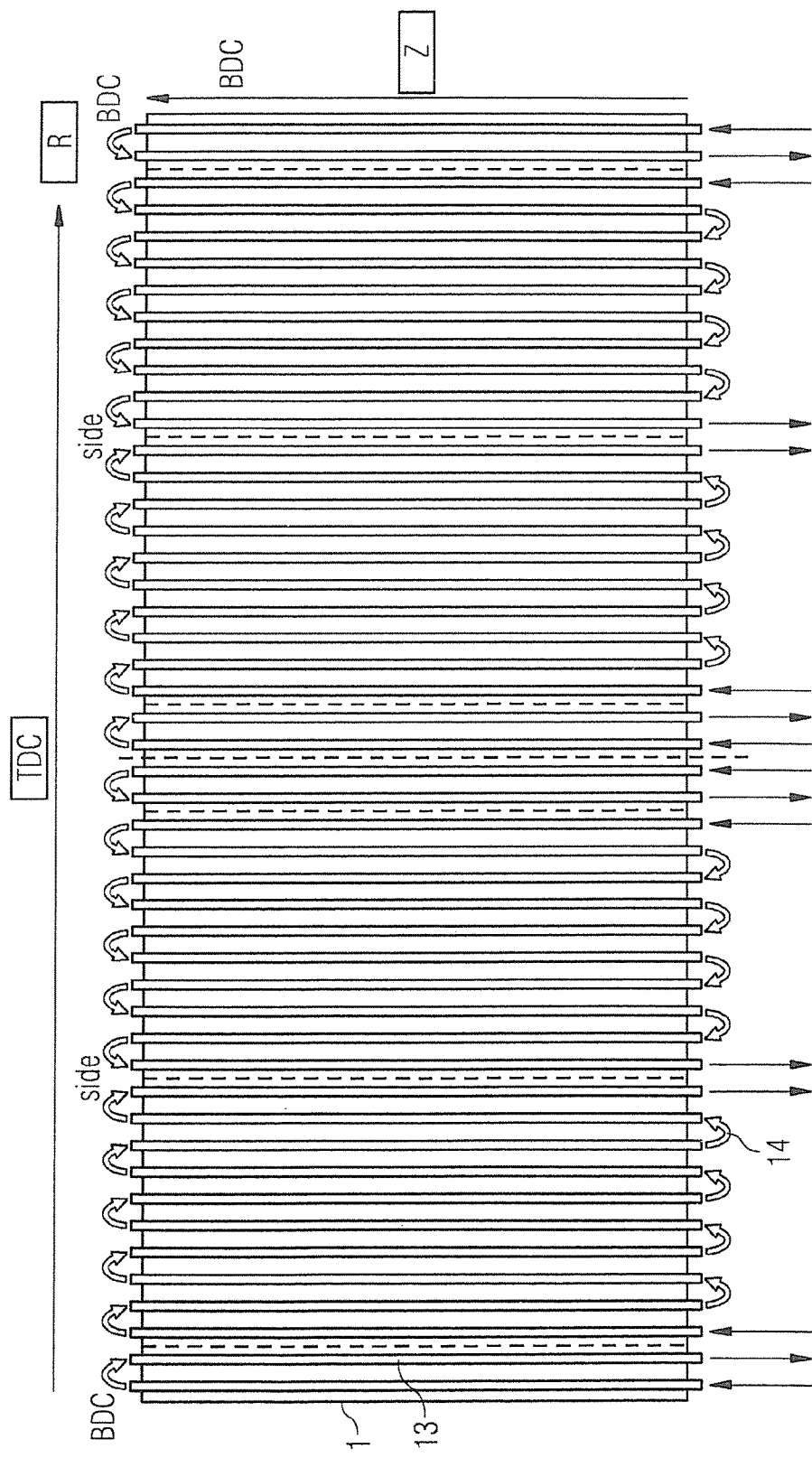

The arrangements of FIGS. 4-8 have shown symmetrical arrangements where all channels are divided up into a number of equal groups. FIG. 9 represents an alternative arrangement, where the groups of channels are unequal in size. Areas of greater cooling requirement, near TDC and BDC in this example, are provided with channels in smaller groups, while areas with reduced cooling requirements, near the sides in this example, are provided with channels in larger groups. By circulating a similar flow rate of cooling fluid through each group, an enhanced cooling capacity is provided to the areas with a greater cooling requirement, while a reduced cooling capacity is provided to areas with a lesser cooling requirement. Of course, one may also adapt the flow rate into each group to further control the cooling capacity in each group. It is even possible to vary the available cooling by use of different cooling fluids in different groups.

All of the embodiments of FIGS. 4-9 use channels 13 connected consecutively, that is to say that each channel 13 is connected by conduits 14 to one or two immediately adjacent channels. This is not necessarily the case, however, and FIG. 10 shows another embodiment in which each group of channels is connected in a spiral style. In each case, cooling fluid is introduced to an outer one of the channels in a group, and proceeds in a spiral fashion until it leaves one of the channels near the centre of the group. The direction of flow of the cooling fluid may of course be reversed. Similarly, other arrangements may be made for connecting the channels together in other orders, for example, a part-spiral, part-consecutive arrangement.

The embodiments illustrated in FIGS. 4-10 each include forty-eight channels 13, which could be arranged to accommodate up to forty-eight shim trays. Other embodiments may be provided with more, or fewer, channels and shim trays, as will be apparent to those skilled in the art.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. An arrangement for shimming a background magnetic field of a cylindrical superconducting magnet for a magnetic resonance imaging apparatus, said arrangement comprising:
    a cylindrical outer vacuum chamber (OVC) bore tube, with rails on a radially inner surface of the OVC bore tube and shim trays containing shim elements mounted between respective rails that extend around the cylindrical OVC bore tube, with multiple arrangements of said shim trays being retained by said rails so as to be adjacent one another around the radially inner surface of the cylindrical OVC bore tube;
    the rails having grooves that accommodate respective edges of respective shim trays;
    an interference fit between each shim tray and at least one of the respective grooves;
    at least some of the rails having a passageway, said passageways being connected by conduits into a coolant circuit for circulation of a coolant fluid therethrough;
    the rails and the shim tray being at least partially constructed of a thermally conductive material, and being in thermal contact with one another and the OVC bore tube, causing the coolant fluid to stabilize a temperature of the OVC bore tube, the shim tray and the shim elements; and
    each shim tray comprising a bottom piece and a lid that is secured to the bottom piece, said lid being in thermal contact with the rails, so that said shim trays and said rails form a thermal shield for the OVC bore tube.

2. An arrangement according to claim 1 wherein the shim trays are mounted to slide along a length of the rails and wherein the arrangement comprises a fixing arrangement that holds the shim tray in a desired position along the length of the rails.

3. An arrangement according to claim 1 wherein at least one shim tray comprises a ferromagnetic or paramagnetic material.

4. An arrangement according to claim 1 wherein each shim tray has respective edges each having a lateral lip, with the grooves retaining the shim trays by the lateral lips.

5. An arrangement according to claim 1 wherein at least one of the rails comprises a ferromagnetic or paramagnetic material.

6. An arrangement according to claim 1 wherein the coolant circuit comprises a cooler.

7. An arrangement according to claim 1 wherein the coolant circuit comprises a circulator.

8. An arrangement according to claim 1 wherein each rail has respective grooves therein, which each hold a respective edge of each of two adjacent shim trays.

9. An arrangement according to claim 1 wherein each rail has respective grooves therein, which each hold a respective lateral lip of each of two adjacent shim trays.

10. An arrangement according to claim 1, wherein the bottom piece and the lid are in thermal contact with each other, so that said bottom piece is also in thermal contact with said rails.

* * * * *